United States Patent
Sun et al.

(10) Patent No.: US 11,328,662 B2
(45) Date of Patent: May 10, 2022

(54) DISPLAY PANEL REPAIR DEVICE AND DISPLAY PANEL REPAIR METHOD

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Shi Sun, Beijing (CN); Xuewu Xie, Beijing (CN); Ameng Zhang, Beijing (CN); Bowen Liu, Beijing (CN); Yu Ai, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 735 days.

(21) Appl. No.: 16/094,704

(22) PCT Filed: Jan. 31, 2018

(86) PCT No.: PCT/CN2018/074771
§ 371 (c)(1),
(2) Date: Oct. 18, 2018

(87) PCT Pub. No.: WO2019/000944
PCT Pub. Date: Jan. 3, 2019

(65) Prior Publication Data
US 2021/0220797 A1    Jul. 22, 2021

(30) Foreign Application Priority Data

Jun. 27, 2017 (CN) .......................... 201710499935.2

(51) Int. Cl.
*G09G 3/3233* (2016.01)
*G09G 3/00* (2006.01)
(Continued)

(52) U.S. Cl.
CPC ............ *G09G 3/3233* (2013.01); *B01J 19/10* (2013.01); *G09G 3/00* (2013.01); *H01L 51/56* (2013.01); *H01L 2251/568* (2013.01)

(58) Field of Classification Search
None
See application file for complete search history.

(56) References Cited

U.S. PATENT DOCUMENTS 5,417,219 A * 5/1995 Takamizawa ......... G01S 15/892
600/472
2007/0139607 A1 6/2007 Nam et al.
2016/0299365 A1 10/2016 Deng et al.

FOREIGN PATENT DOCUMENTS

CN        1873480 A      12/2006
CN        1987557 A       6/2007
(Continued)

OTHER PUBLICATIONS

"Ultrasound Beam Shape & Focusing" (Year: 2000).*
(Continued)

*Primary Examiner* — Evren Seven

(57) ABSTRACT

A display panel repair device and a display panel repair method are disclosed. The display panel repair device includes an ultrasonic generator and a beam control device. The ultrasonic generator is configured to generate ultrasonic; and the beam control device is configured to direct the ultrasonic to emit to a pre-determined position, so as to be able to repair a display panel to be repaired by the ultrasonic.

16 Claims, 7 Drawing Sheets

(51) Int. Cl.
  *B01J 19/10* (2006.01)
  *H01L 51/56* (2006.01)

(56) References Cited

FOREIGN PATENT DOCUMENTS

| | | | |
|---|---|---|---|
| CN | 103558698 | A | 2/2014 |
| CN | 104459394 | A | 3/2015 |
| CN | 104991391 | A | 10/2015 |
| CN | 205826999 | U | 12/2016 |
| CN | 106782247 | A | 5/2017 |
| JP | 2009-004172 | A | 1/2009 |
| WO | 2004/031791 | A2 | 4/2004 |
| WO | WO-2013186961 | A1 * | 12/2013 ......... H01L 51/5203 |

OTHER PUBLICATIONS

The First Chinese Office Action dated Nov. 29, 2013; Appln. No. 201710499935.2.
The International Search Report and Written Opinion dated Apr. 27, 2018: PCT/CN2018/074771.

\* cited by examiner

DISPLAY PANEL REPAIR DEVICE AND DISPLAY PANEL REPAIR METHOD

The application claims priority to Chinese patent application No. 201710499935.2, filed on Jun. 27, 2017, the entire disclosure of which is incorporated herein by reference as part of the present application.

TECHNICAL FIELD

Embodiments of the present disclosure relate to a display panel repair device and a display panel repair method.

BACKGROUND

In the manufacturing process of an organic light emitting diode (OLED) display panel, a bright dot defect can exist in the display panel if a foreign matter establishes an electrically connection between an anode (for example, ITO) of a pixel and a high potential power line (for example, VDD), that is, at least one pixel of the display panel can act to emit light continuously.

SUMMARY

At least one embodiment of the present disclosure provides a display panel repair device, and the display panel repair device includes an ultrasonic generator and a beam control device. The ultrasonic generator is configured to generate ultrasonic; and the beam control device is configured to direct the ultrasonic to emit to a pre-determined position, so as to be able to repair a display panel to be repaired by the ultrasonic.

For example, in the display panel repair device provided by at least one embodiment of the present disclosure, the beam control device includes a beam size control component provided in an emitting path of the ultrasonic; and the beam size control component includes a beam-transmitting region which allows the ultrasonic to pass through, and a beam-shielding region which blocks the ultrasonic.

For example, in the display panel repair device provided by at least one embodiment of the present disclosure, the beam size control component includes two slits which intersect with each other; a distance between the two slits is adjustable; and an intersection area of the two slits forms the beam-transmitting region for the ultrasonic.

For example, in the display panel repair device provided by at least one embodiment of the present disclosure, the beam control device includes a beam focusing element; the beam focusing element is provided in an emitting path of the ultrasonic; and the beam focusing element is configured to focus the ultrasonic.

For example, the display panel repair device provided by at least one embodiment of the present disclosure further includes an alignment device. The alignment device is configured to align the beam control device with a sub-pixel to be repaired of the display panel; and the alignment device includes a first image acquisition device, and the first image acquisition device is configured to obtain position information of the sub-pixel to be repaired through acquiring an image of at least part of a display region of the display panel.

For example, the display panel repair device provided by at least one embodiment of the present disclosure further includes a beam axis integration structure. The beam axis integration structure is configured to allow a light path of the first image acquisition device to coincide with a beam axis of the ultrasonic on the display panel; and the beam axis integration structure is configured to allow at least part of the ultrasonic outputted by the ultrasonic generator to be able to be incident onto the sub-pixel to be repaired through reflection, and to allow the first image acquisition device to be able to acquire an image of the sub-pixel to be repaired through transmission, such that the light path of the first image acquisition device coincides with the beam axis of the ultrasonic on the display panel For example, in the display panel repair device provided by at least one embodiment of the present disclosure, the beam axis integration structure includes a glass plate; the glass plate includes a first surface and a second surface; the ultrasonic generator faces toward the first surface, and the ultrasonic outputted by the ultrasonic generator is incident onto the first surface, and is reflected to the sub-pixel to be repaired by the first surface; and the first image acquisition device faces toward the second surface, light of the image of the sub-pixel to be repaired is incident onto the first surface, and is able to transmitted from the first surface to the first image acquisition device through transmission, wherein the first image acquisition device is located at a side, at which the second surface is provided, of the glass plate.

For example, the display panel repair device provided by at least one embodiment of the present disclosure further includes a second beam axis integration structure. The second beam axis integration structure is configured to allow a light path of the first image acquisition device and a beam axis of the ultrasonic to be able to sequentially intersect the sub-pixel to be repaired by moving the ultrasonic generator and the first image acquisition device.

For example, in the display panel repair device provided by at least one embodiment of the present disclosure, the second beam axis integration structure includes a guide rail, a first slide block, and a second slide block. The guide rail includes an alignment mark; the first slide block fixedly connects with the first image acquisition device, wherein the first slide block is configured to allow the light path of the first image acquisition device to be able to intersect with the sub-pixel to be repaired; and the second slide block fixedly connects with the ultrasonic generator, wherein the second slide block is configured to allow the beam axis of the ultrasonic to be able to intersect with the sub-pixel to be repaired.

For example, the display panel repair device provided by at least one embodiment of the present disclosure further includes a displacement mechanism. The displacement mechanism is configured to move the ultrasonic generator and the beam control device with respect to the display panel to be repaired based on position information of a sub-pixel to be repaired of the display panel, so as to realize alignment between the ultrasonic generator and the sub-pixel to be repaired.

For example, in the display panel repair device provided by at least one embodiment of the present disclosure, the displacement mechanism realizes the alignment between the ultrasonic generator and the sub-pixel to be repaired by moving the ultrasonic generator and the beam control device.

At least one embodiment of the present disclosure further provides a display panel repair method, and the display panel repair method includes: generating ultrasonic; and directing the ultrasonic to emit to a pre-determined position, so as to be able to repair a display panel to be repaired by the ultrasonic.

For example, in the display panel repair method provided by at least one embodiment of the present disclosure, the display panel includes a plurality of sub-pixels arranged in parallel; and the ultrasonic is directed to emit to a sub-pixel to be repaired of the display panel to be repaired.

For example, the display panel repair method provided by at least one embodiment of the present disclosure further includes: controlling a parameter of the ultrasonic which is incident onto the sub-pixel to be repaired of the display panel to be repaired, so as to allow the ultrasonic to be able to act on a sub-pixel to be repaired of the display panel to be repaired only.

For example, in the display panel repair method provided by at least one embodiment of the present disclosure, a size of a beam of the ultrasonic, which is incident onto the sub-pixel to be repaired, is controlled through shielding.

For example, in the display panel repair method provided by at least one embodiment of the present disclosure, an energy density of a beam of the ultrasonic, which is incident onto the sub-pixel to be repaired, is controlled through focusing.

For example, the display panel repair method provided by at least one embodiment of the present disclosure further includes: obtaining position information of the sub-pixel to be repaired by acquiring an image of at least part of a display region of the display panel, so as to direct the ultrasonic to emit to the sub-pixel to be repaired.

For example, the display panel repair method provided by at least one embodiment of the present disclosure further includes: allowing at least part of the ultrasonic to be able to be incident onto the sub-pixel to be repaired through reflection, and allowing the image of the sub-pixel to be repaired to be able to be acquired through transmission.

BRIEF DESCRIPTION OF THE DRAWINGS

In order to clearly illustrate the technical solution of the embodiments of the disclosure, the drawings used in the description of the embodiments or relevant technologies will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

During research, the inventors noted that a bright dot defect may exist in a pixel unit of an OLED display panel for the following reasons. Reasons that the bright dot defect exists in the display panel will be described in detail in the following with reference to FIG. 1-FIG. 3.

Figure 1:
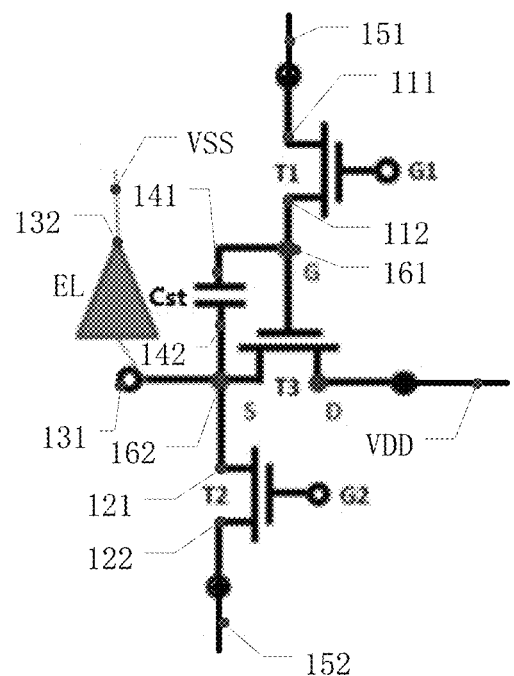
FIG. 1 is an exemplary circuit diagram of a pixel circuit of a pixel unit of an OLED display panel.

For example, FIG. 1 is an exemplary circuit diagram of a pixel circuit of a pixel unit of an OLED display panel. As illustrated in FIG. 1, the pixel circuit of the OLED display panel includes a first transistor T1, a second transistor T2, a third transistor T3, a storage capacitor Cst and a light-emitting element EL. The third transistor T3 is a driving transistor, and the control terminal G, the first terminal S and the second terminal D of the third transistor T3 electrically connect to a first node 161, a second node 162, and a high potential power line VDD respectively. The first transistor T1 is a switching transistor, and includes a control terminal G1, a first terminal 111, and a second terminal 112, and the first terminal 111 and the second terminal 112 of the first transistor T1 electrically connect to a signal line 151 and the first node 161 respectively. The second transistor T2 is a sensing transistor, and includes a control terminal G2, a first terminal 121 and a second terminal 122, and the first terminal 121 and the second terminal 122 of the second transistor T2 electrically connect to the second node 162 and a sensing line 152 respectively. A first terminal 141 and a second terminal 142 of the storage capacitor Cst electrically connect to the first node 161 and the second node 162 respectively. A first terminal 131 (i.e., an anode terminal) and a second terminal 132 (i.e., a cathode terminal) of the light-emitting element EL electrically connect to the second node 162 and a low potential power line VSS respectively.

For example, for the light-emitting element EL of the pixel circuit as illustrated in FIG. 1, in the case where the turning-on signal outputted by the signal line 151 (for example, a signal with a high voltage level) is transmitted to the first node 161 (i.e., the control terminal of the third transistor T3) through the first transistor T1 in a turn-on state and is stored in the storage capacitor Cst, the third transistor T3 is turned on and the high potential voltage, which is originated from the high potential power line VDD, is applied to the first terminal 131 (i.e., the anode terminal) of the light-emitting element EL. The high potential voltage can be considered to be approximately equal to a power source voltage VDD if the voltage drop between two terminals of the third transistor T3 is relatively small. The light-emitting element EL emits light when the voltage difference between the high potential voltage and the low potential power line VSS (for example, VSS) is larger than the turning-on voltage of the light-emitting element EL. In the case where the turning-off signal (for example, a signal with a low voltage level) outputted by the signal line 151 is transmitted to the first node 161 through the first transistor T1 in a turn-on state and is stored in the storage capacitor Cst, the third transistor T3 is turned off and the light-emitting element EL emits no light.

Figure 2A:
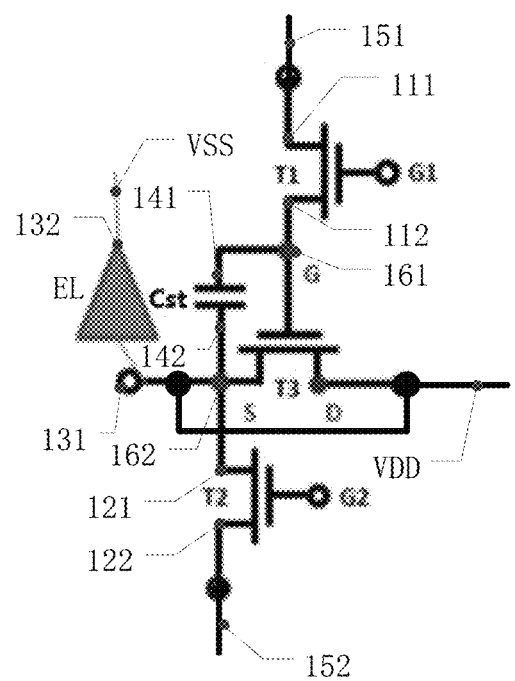
FIG. 2A is an exemplary circuit diagram of a pixel circuit in a case where a bright dot defect exists in a pixel unit of an IDLED display panel.

For example, FIG. 2A is an exemplary circuit diagram of the pixel circuit in the case where a bright dot defect exists in a pixel unit of the OLED display panel. For example, compared with the pixel circuit as illustrated in FIG. 1, the high potential power line VDD and the first terminal 131 (i.e., an anode terminal) of the pixel circuit, which are illustrated in FIG. 2A, of the light-emitting element EL are short-circuited. The short circuit between the first terminal 131 of the light-emitting element El and the high potential power line VDD can be caused by various reasons. For example, the first terminal S and the second terminal D of the third transistor T3 can be connected by a foreign matter. Because the first terminal S of the third transistor T3 electrically connects to the first terminal 131 of the light-emitting element EL and the second terminal D of the third transistor T3 electrically connects to the high potential power line VDD, the first terminal 131 of the light-emitting element EL and the high potential power line VDD are short-circuited.

Figure 2B:
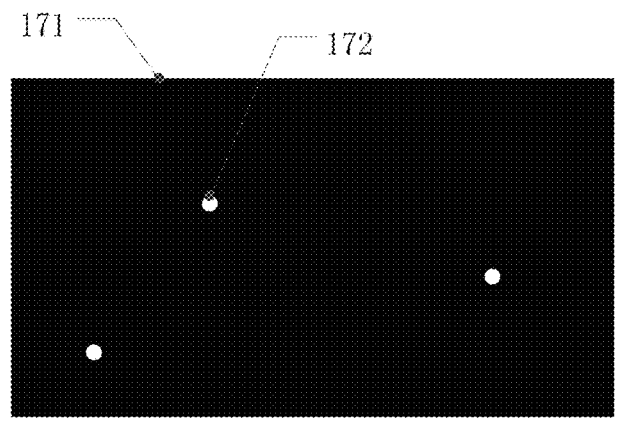
FIG. 2B is a schematic diagram of an image which is displayed in all-black operation mode by a display panel with bright dot defects.

For example, in the case where the voltage of the high potential power line VDD is equal to 24V and the voltage of the low potential power line VSS is equal to 0V, the short circuit between the high potential power line VDD and the anode terminal of the light-emitting element EL lets the voltage of the anode terminal of the light-emitting element EL be equal to 24V, and allows the voltage difference between the anode terminal and the cathode terminal of the light-emitting element EL to be constantly equal to 24V. In this case, the light-emitting element EL continues to emit light regardless of whether or not the third transistor T3 is turned on, that is, the bright dot defect issue exists in the pixel unit of the display panel. FIG. 2B is a schematic diagram of an image displayed in all-black operation mode by a display panel 171 with bright dot defects. As illustrated in FIG. 2B, for the display panel 171 with bright dot defects, at least one bright dot 172 exists in the display panel in all-black operation mode.

The inventors further noted that the pixel unit with the bright dot defect can be repaired into a dark dot through cutting the high potential power line by laser or through destroying the pixel unit (for example, destroying the material of the organic light-emitting layer of the pixel unit) with the bright dot defect by laser. However, the inventors noted that the following technical problems exist in the above-mentioned two repair method.

Figure 3A:
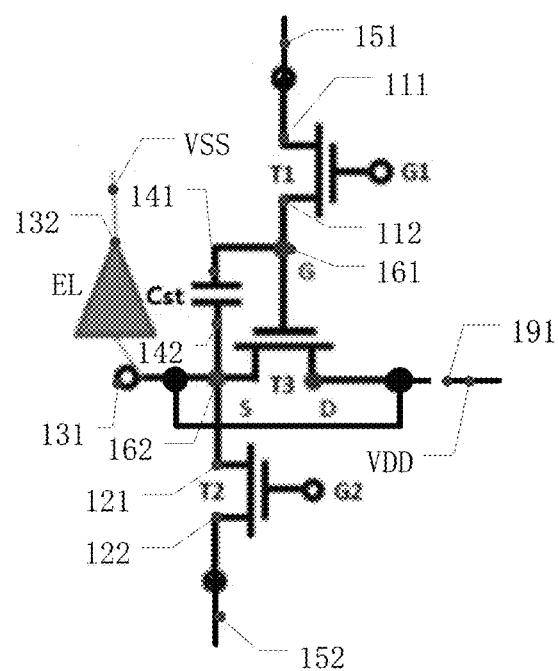
FIG. 3A is a schematic diagram illustrating repairing of a display panel through cutting a high potential power line by laser.

For example, FIG. 3A is a schematic diagram of repairing a display panel through cutting a high potential power line by laser. For example, as illustrated in FIG. 3A, the high potential power line VDD may be cut by laser at a cutting position 191 for example, so as to allow the high potential power line VDD, which is located at the left of the cutting position 191, not to connect to a high potential power supply terminal (not illustrated in figures). In this case, the potential voltage of the high potential power supply terminal cannot transmit to the anode terminal of the light-emitting element EL through the disconnected high potential power line VDD regardless of whether or not the third transistor T3 is turned on. Therefore, the light-emitting element EL emits no light, and the bright dot can be repaired into a dark dot. However, the inventors noted that, in order to ensure flatness of a film formed, a thick resin layer may be provided between the high potential power line VDD of the OLED display panel and the cathode of the light-emitting element EL. For example, during cutting the high potential power line VDD by laser, a portion, which is melted by laser, of the high potential power line VDD, forms conductive particles, and at least part of the conductive particles cannot be removed the OLED display panel, and are accumulated at both sides of the high potential power line VDD, this causes that the high potential power line VDD is still connected, and therefore, the success rate of repairing the bright dot defect of the display panel by cutting the high potential power line VDD with laser is relatively low.

Figure 3B:
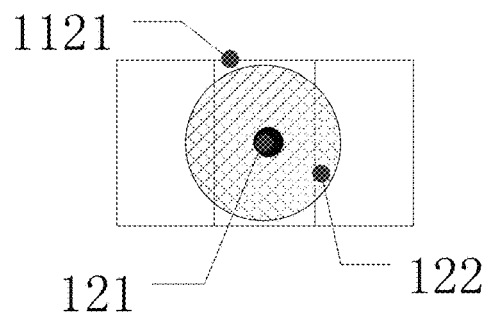
FIG. 3B is a schematic diagram illustrating repairing of a display panel through destroying a pixel unit to be repaired by laser.

For example, as illustrated in FIG. 3B, for the repair method through destroying the pixel unit (for example, destroying the material of the organic light-emitting layer of the pixel unit) with the bright dot defect by laser, the laser can act on the action spot 121 of the pixel unit 1121 (for example, the material of the organic light-emitting layer of the pixel unit) to be repaired, the laser can be absorbed by the pixel unit 1121 to be repaired and converted into heat. Furthermore, the thermal effect area 122 of the laser can go beyond the pixel unit to be repaired. Therefore, during repairing the pixel unit 1121 to be repaired by laser, the pixel units adjacent to the pixel unit 1211 to be repaired (for example, the pixel units at the left and the right of the pixel unit 1121 to be repaired) can be adversely affected by the thermal effect of the laser, and this can cause the pixel units (for example, the pixel units which emit light normally) adjacent to the pixel unit 1211 to be repaired to become dark dots, and therefore, the repair effect of the above-mentioned method is degraded.

The embodiments of the present disclosure provides a display panel repair device and a display panel repair method, and the display panel repair device and the display panel repair method can increase the repair rate of the display panel and can reduce the adverse effect to the pixel units, which are adjacent to the pixel unit to be repaired, of the display panel.

At least one embodiment of the present disclosure provides a display panel repair device, and the display panel repair device includes an ultrasonic generator and a beam control device. The ultrasonic generator is configured to generate ultrasonic; and the beam control device is configured to direct the ultrasonic to emit to a pre-determined position, so as to be able to repair a display panel to be repaired by the ultrasonic.

At least one embodiment of the present disclosure further provides a display panel repair method, and the display panel repair method includes: generating ultrasonic; and directing the ultrasonic to emit to a pre-determined position, so as to be able to repair a display panel to be repaired by the ultrasonic.

Non-limitive descriptions are given to the display panel repair device and the repair method provided by the embodiments of the present disclosure in the following with reference to a plurality of examples. As described in the following, in case of no conflict, different features in these specific examples may be combined so as to obtain new examples, and the new examples are also fall within the scope of present disclosure.

Figure 4:
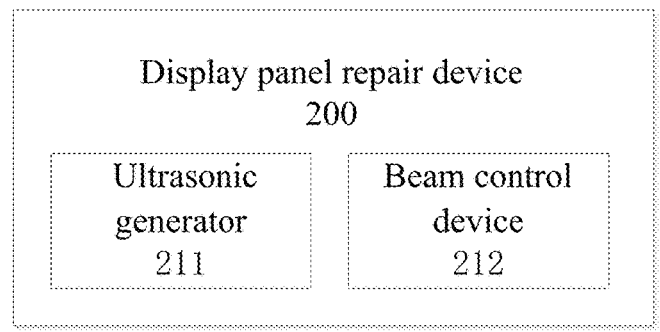
FIG. 4 an exemplary block diagram of a display panel repair device provided by at least one embodiment of the present disclosure.

At least one embodiment of the present disclosure provides a display panel repair device 200, and the display panel repair device 200 can be used to repair a defect (for example, a bright dot defect) of a display panel (for example, an OLED display panel). For example, FIG. 4 illustrates an exemplary block diagram of the display panel repair device 200 provided by at least one embodiment of the present disclosure. For example, the display panel repair device 200 may include an ultrasonic generator 211 and a beam control device 212. For example, specific configurations of the ultrasonic generator 211 and the beam control device 212 can be set according to specific implementation demands, and no specific limitation will be given to the embodiments of the present disclosure in this respect.

Figure 5A:
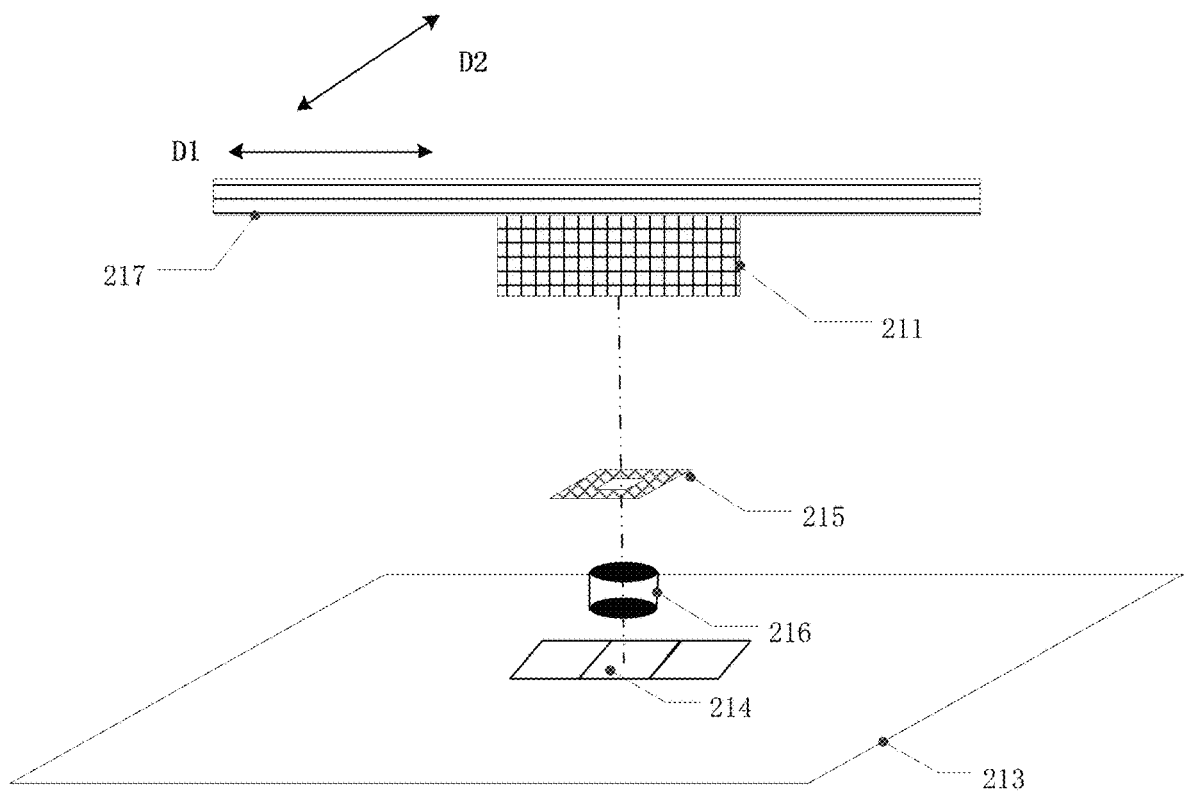
FIG. 5A is an exemplary side view of a display panel repair device provided by at least one embodiment of the present disclosure.
Figure 5B:
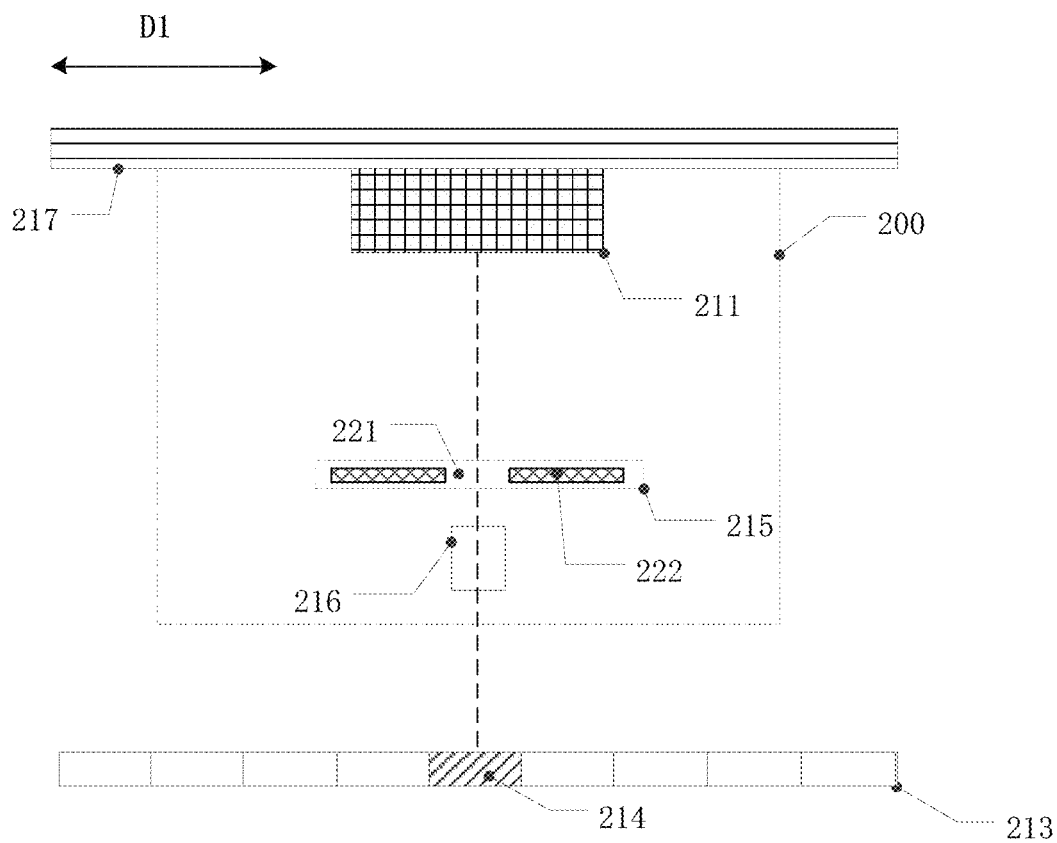
FIG. 5B is a cross-sectional view of the display panel repair device as illustrated in FIG. 5A.

For example, FIG. 5A is an exemplary side view of the display panel repair device 200 provided by at least one embodiment of the present disclosure, and FIG. 5B is a cross-sectional view of the display panel repair device 200 as illustrated in FIG. 5A.

For example, as illustrated in FIG. 5A and FIG. 5B, the ultrasonic generator 211 is configured to generate ultrasonic. For example, the type of the ultrasonic generator 211, the frequency (for example, 0.5-5 MHz) of the outputted ultrasonic and the power of the outputted ultrasonic can be set according to specific implementation demands, and no specific limitation will be given to the embodiments of the present disclosure in this respect. For example, the directionality of the ultrasonic is increased along with an increase of the frequency of the ultrasonic, and therefore, in the case where the resolution of the display panel 213 is relatively high, the ultrasonic generator 211 may adopt an ultrasonic generator which outputs high frequency (for example, 2 MHz) ultrasonic. For example, the power of the ultrasonic outputted by the ultrasonic generator 211 and the time during which the ultrasonic to act on the pixel unit 214 to be repaired may be determined according to factors such as the energy loss of the ultrasonic during propagation, the specific structures of the pixel unit 214 to be repaired, the material of the organic light-emitting layer of the pixel unit 214 to be repaired, and the resolution of the display panel 213. For example, the power of the ultrasonic outputted by the ultrasonic generator 211 and the time during which the ultrasonic to act on the pixel unit 214 to be repaired may be determined through conducting experiment.

For example, the beam control device 212 may be configured to direct the ultrasonic to emit to a pre-determined position, such that the display panel 213 to be repaired can be repaired by the ultrasonic. For example, the display panel 213 may include a plurality of sub-pixels (for example, the pixel units) arranged in parallel, and the ultrasonic may be directed to emit to the sub-pixel to be repaired (for example, the pixel unit 214 to be repaired) of the display panel 213 to be repaired, but the embodiments of the present disclosure are not limited to this case.

For example, after the ultrasonic outputted by the ultrasonic generator 211 is incident onto the pixel unit 214 to be repaired (for example, the pixel unit with the bright dot defect), violent vibration of the ultrasonic can cause relevant structures (for example, the material of the organic light-emitting layer) of the pixel unit to perform high-frequency vibration. Furthermore, part of the energy of the ultrasonic can be converted into thermal energy, this causes an increase of the temperature of the local region adjacent to the action spot by the ultrasonic (i.e., the incident spot of the ultrasonic on the pixel unit 214 to be repaired). Therefore, the ultrasonic may destroy the relevant structures (for example, the material of the organic light-emitting layer) of the pixel unit, and cause the pixel unit 214 to be repaired not to emit light, and thus the display panel repair device 200 provided by at least one embodiment of the present disclosure can repair the pixel unit 214 to be repaired into a dark dot, and the repair device 200 has a relatively high success rate of reparation.

For example, because the thermal effect caused by the ultrasonic is smaller than the thermal effect caused by laser, the ultrasonic outputted by the ultrasonic generator 211 can act on the pixel unit 214 to be repaired only, without affecting normal light-emitting of the pixel units (for example, the pixel units provided at the left and the right of the pixel unit 214 to be repaired) adjacent to the pixel unit 214 to be repaired. Therefore, for the display panel repair device 200 provided by at least one embodiment of the present disclosure, during the process of repairing the pixel unit 214 to be repaired into the dark dot, adverse influence to the pixel units adjacent to the pixel unit 214 to be repaired can be deceased and the repair effect can be improved.

For example, as illustrated in FIG. 5A and FIG. 5B, the display panel repair device 200 may further include a displacement mechanism 217. For example, the displacement mechanism 217 may be configured to move the ultrasonic generator 211 and the beam control device 212 with respect to the display panel 213 to be repaired based on the position information of the sub-pixel to be repaired (for example, the pixel unit 214 to be repaired) of the display panel 213, so as to realize the alignment between the ultrasonic generator 211 and the sub-pixel to be repaired (for example, the coarse alignment between the beam control device and the sub-pixel to be repaired can be realized in this case). For example, the displacement mechanism 217 may drive the ultrasonic generator 211 and the beam control device 212 to move along a first direction D1 and a second direction D2. For example, the first direction D1 and the second direction D2 may be perpendicular to each other in a plane parallel to the display panel 213 to be repaired.

Figure 8A:
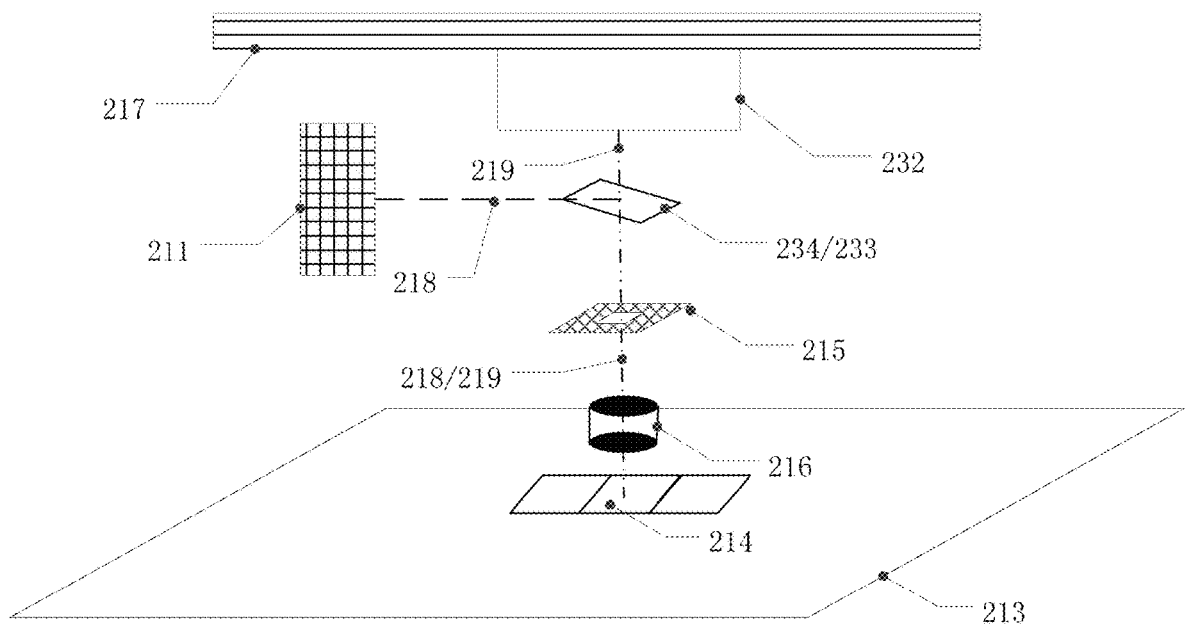
FIG. 8A is an exemplary side view of another display panel repair device provided by at least one embodiment of the present disclosure.
Figure 8B:
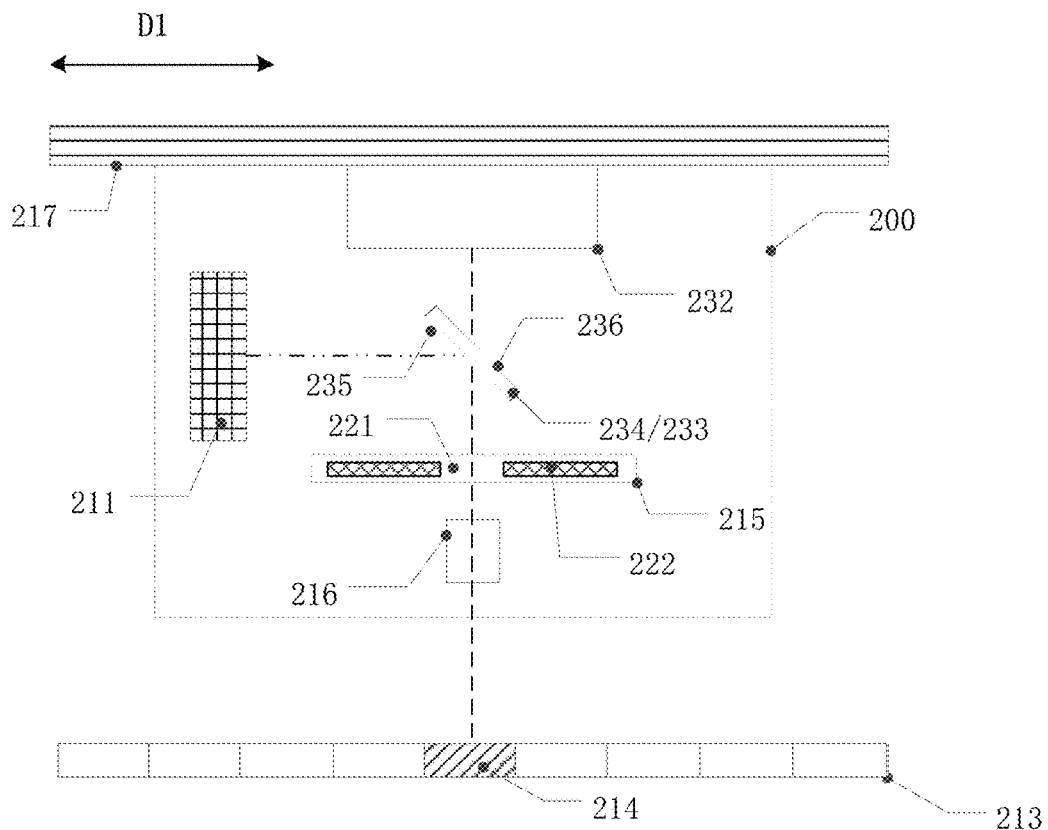
FIG. 8B is a cross-sectional view of the display panel repair device as illustrated in FIG. 8A.

For example, the position information of the sub-pixel to be repaired of the display panel 213 may be the information indicating the row and the column of the sub-pixel to be repaired; for another example, the position information of the sub-pixel to be repaired of the display panel 213 may also be the position coordinates of the sub-pixel to be repaired with respect to a reference point. For example, the position information of the sub-pixel to be repaired of the display panel 213 may be inputted into the control device of the displacement mechanism 217 from outside of the repair device 200; for another example, the position information of the sub-pixel to be repaired of the display panel 213 may also be obtained by a relevant device of the repair device 200, and provided to the control device of the displacement mechanism 217 (for example, specific methods may refer to the embodiments as illustrated in FIG. 8A and FIG. 8B).

For example, the displacement mechanism 217 may be a two dimensional electrically driven stage, but the embodiments of the present disclosure are not limited to this case. For example, the adjusting accuracy of the displacement mechanism 217 may be set according to the resolution of the display panel 213. For example, the adjusting accuracy of the displacement mechanism 217 may allow the ultrasonic outputted by the ultrasonic generator 211 to act on the pixel unit 214 to be repaired only. For example, the displacement mechanism 217 may realize the alignment between ultrasonic generator 211 and the sub-pixel to be repaired (for example, the pixel unit to be repaired) by moving (for example, through translation of) the ultrasonic generator 211 and the beam control device 212; for another example, the displacement mechanism 217 may also realize the alignment between the ultrasonic generator 211 and the sub-pixel to be repaired by moving the display panel 213 to be repaired.

For example, specific structures and configurations of the beam control device 212 can be set according to specific implementation demands, and no specific limitation will be given to the embodiments of the present disclosure in this respect.

For example, as illustrated in FIG. 5A and FIG. 5B, the beam control device 212 may include a beam size control component 215 provided in the emitting path of the ultrasonic, and the beam size control component 215 includes a beam-transmitting region 221 which allows the ultrasonic to pass through and a beam-shielding region 222 which blocks the ultrasonic. For example, the beam size control component 215 can further decrease the adverse effect of the ultrasonic to the pixel units, which are adjacent to the pixel unit 214 to be repaired, through controlling the beam size of the ultrasonic which is incident onto the pixel unit 214 to be repaired, and therefore, the repair effect can be further increased. For example, specific structures of the beam size control component 215 can be set according to specific implementation demands, and no specific limitation will be given to the embodiments of the present disclosure in this respect.

Figure 6:
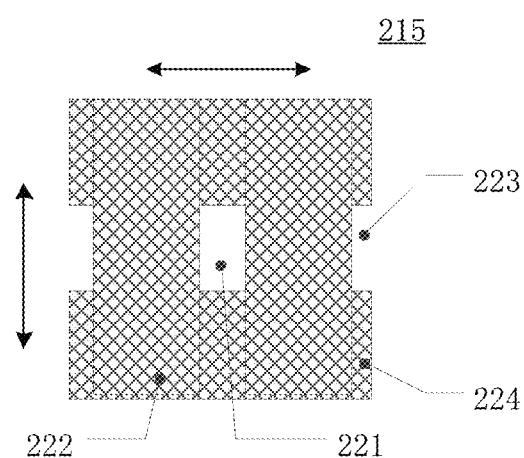
FIG. 6 is an exemplary structural view of a beam size control component provided by at least one embodiment of the present disclosure.

For example, as illustrated in FIG. 6, the beam size control component 215 may include two slits 223 which intersect with each other, and the distance between the two slits 223 is adjustable. The intersection area of the two slits 223 forms the beam-transmitting region 221 for the ultrasonic. For example, the two slits 223 may be perpendicular to each other, and therefore, the beam-transmitting region 221, which is formed by the intersection area of two slits 223, for the ultrasonic is in a rectangular shape. For example, each of the slits 223 may be formed by two shielding units (sheet metals 224) which are opposite to each other, and the distance between the two shielding units is adjustable. The ultrasonic which is incident onto the sheet metals 224 may be reflected by the sheet metals 224, and therefore, the region corresponding to the sheet metals 224 forms the beam-shielding region 222 of the beam size control component; and the beam-transmitting region 221, which forms by the intersection area of two slits 223, for the ultrasonic corresponds to the beam-transmitting region 221 of the beam size control component. Therefore, the size of the beam of the ultrasonic which is incident onto the pixel unit to be repaired can be controlled through controlling the size of the beam-transmitting region 221 of the beam size control component, and thus the adverse effect of the beam of the ultrasonic to the pixel units adjacent to the pixel unit 214 to be repaired can be decreased. For example, the specific structure of the beam size control component 215 is not limited to the structure as illustrated in FIG. 6, the beam size control component 215, for example, may also include a circular beam-transmitting region and a circular ring type beam-shielding region, and no specific limitation is given to the embodiments of the present disclosure in this respect.

For example, as illustrated in FIGS. 5A and 5B, the beam control device 212 may further include a beam focusing element 216 provided in the emitting path of the ultrasonic, and the beam focusing element 216 may be configured to focus the ultrasonic. For example, the size of the beam of the ultrasonic which is incident onto the pixel unit 214 to be repaired can be decreased through providing the beam focusing element 216 in the emitting path of the ultrasonic, and therefore, the energy density of the beam of the ultrasonic which is incident onto the pixel unit 214 to be repaired can be decreased, the repair rate of the display panel 213 can be increased, and the adverse effect to the pixel units adjacent to the pixel unit 214 to be repaired can be further decreased, that is, the repair effect of the display panel 213 can be improved.

For example, specific structures of the beam focusing element 216 can be set according to specific implementation demands, and no specific limitation will be given to the embodiments of the present disclosure in this respect. For example, the beam of the ultrasonic may be focused by adopting an acoustic focusing method (for example, a geometric focusing method or a mechanical focusing method) or an electronic focusing method. For example, the geometric focusing method can be divided into an acoustic lens focusing method and an acoustic reflective mirror focusing method. For example, the mechanical focusing method includes a concave-oscillator focusing method. For example, specific structures and parameters of the beam focusing element 216 may refer to related ultrasonic beam focusing technologies, and no further descriptions will be given here.

For example, according to specific implementation demands, the beam control device 212 may include any one or the combination of the beam size control component 215 and the beam focusing element 216. For example, as illustrated in FIGS. 5A and 5B, in the case where the beam control device 212 includes the beam size control component 215 and the beam focusing element 216, compared with the beam size control component 215, the beam focusing element 216 may be closer to the display panel 213 to be repaired, and therefore, the demand for the position adjustment accuracy of the beam size control component 215 can be decreased, but the embodiments of the present disclosure are not limited to this case.

Figure 7:
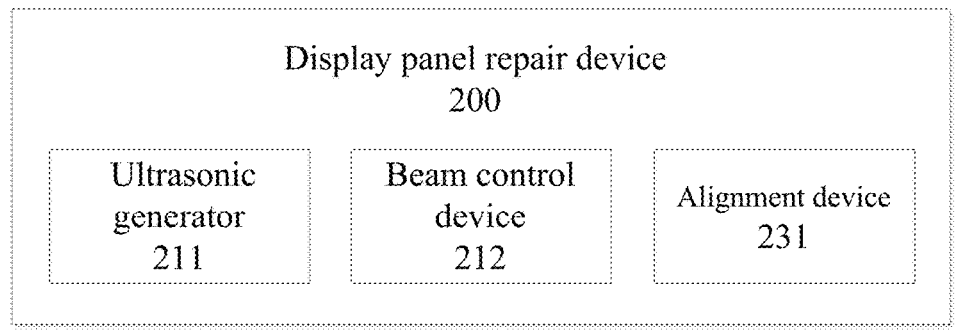
FIG. 7 is an exemplary block diagram of another display panel repair device provided by at least one embodiment of the present disclosure.

For example, the embodiments of the present disclosure further provides another display panel repair device 200, and the display panel repair device 200 can be used to repair the defect (for example, the bright dot defect) of the display panel 213 (for example, the OLED display panel). For example, FIG. 7 illustrates an exemplary block diagram of another display panel repair device 200. For example, the display panel repair device 200 may include the ultrasonic generator 211, the beam control device 212 and the alignment device 231. For example, detailed descriptions and arrangements of the ultrasonic generator 211, the beam control device 212 and other related devices may refer to the embodiments as illustrated in FIG. 5A and FIG. 5B, and no further descriptions will be given here.

For example, FIG. 8A is an exemplary side view of another display panel repair device 200 provided by at least one embodiment of the present disclosure, and FIG. 8B is a cross-sectional view of the display panel repair device 200 as illustrated in FIG. 8A. For example, as illustrated in FIG. 8A and FIG. 8B, the alignment device 231 may include a first image acquisition device 232, and the first image acquisition device 232 may be configured to obtain the position information of the sub-pixel to be repaired through acquiring the image of at least part of the display region (for example, several pixel units) of the display panel 213. For example, the first image acquisition device 232 may be configured to acquire the image of several pixel units of the display panel 213, and the ultrasonic generator 211 can be aligned with respect to the pixel unit 214 to be repaired (for example, the center of the pixel unit 214 to be repaired) based on the acquired image of several pixel units, and therefore, the adverse effect to the pixels adjacent to the pixel unit 214 to be repaired can be further decreased. For example, according to specific implementation demands, the alignment device 231 may further include the displacement mechanism, such that the alignment device can align the ultrasonic generator 211 with respect to the pixel unit 214 to be repaired (for example, the center of the pixel unit 214 to be repaired) based on the position information of the sub-pixel to be repaired.

For example, after the ultrasonic repairs the pixel unit 214 to be repaired, the first image acquisition device 232 may acquire the image of the pixel unit 214 to be repaired and the image of the pixel units adjacent to the pixel unit 214 to be repaired, and the repair effect of the ultrasonic with specific parameters to the pixel unit 214 to be repaired and the adverse effect to the pixel units adjacent to the pixel unit 214 to be repaired can be analyzed and determined, and the above-mentioned analysis result and determination result can be used to further optimize, for example, the parameter of the ultrasonic outputted by the ultrasonic generator 211 and/or the parameter of relevant structure of the beam control device 212, and therefore the display panel repair device 200 has an increased repair rate and an improved repair effect.

For example, in order to integrate the first image acquisition device 232 into the repair device 200, the display panel repair device 200 provided by at least one embodiment of the present disclosure may further include a beam axis integration structure. For example, the beam axis integration structure is configured to allow the light path of the first image acquisition device to coincide (for example, substantially coincide) with the beam axis of the ultrasonic (for example, the symmetry axis of the beam of the ultrasonic) on the display panel. For example, specific configurations of the beam axis integration structure can be set according to specific implementation demands, and no specific limitation will be given to the embodiments of the present disclosure in this respect.

For example, the beam axis integration structure 233 may be configured to allow at least part of the ultrasonic outputted by the ultrasonic generator 211 to be able to be incident onto the sub-pixel to be repaired through reflection, and allow the first image acquisition device 232 to be able to acquire the image of the sub-pixel to be repaired through transmission, and therefore, the light path 219 of the first image acquisition device can coincide with (for example, kept to coincide with) the beam axis of the ultrasonic 218 on the display panel 213.

For example, as illustrated in FIG. 8A and FIG. 8B, the beam axis integration structure 233 may include a glass plate 234, and the glass plate 234 includes a first surface 235 and a second surface 236. The ultrasonic generator 211 faces toward the first surface 235, and the ultrasonic outputted by the ultrasonic generator 211 is incident onto the first surface 235, and reflected onto the sub-pixel to be repaired by the first surface 235. The first image acquisition device 232 faces toward the second surface 236, and the light of the image of the sub-pixel to be repaired is incident onto the first surface 235 and is able to transmit through transmission from the first surface 235 to the first image acquisition device 232, which is provided at a side of the second surface 236 of the glass plate 234. For example, the glass plate 234 may be configured to allow the intersecting point of the beam axis of the ultrasonic 218 with the glass plate 234 to coincide with the intersecting point of the light path 219 of the first image acquisition device (for example, the optic axis) with the glass plate 234, and allow the intersecting point of the beam axis of the ultrasonic 218 with the display panel 213 to coincide with the intersecting point of the light path 219 of the first image acquisition device (for example, the optic axis) with the display panel 213, and therefore, the beam axis of the ultrasonic 218 which is between the glass plate 234 and the display panel 213 to be repaired can coincide with the light path 219 of the first image acquisition device. Therefore, the repair condition of the pixel unit 214 to be repaired and/or the adverse effect of the ultrasonic to the pixel adjacent the pixel unit 214 to be repaired can be monitored in real time, and the display panel repair device 200 has an increased repair rate and an improved repair effect.

Figure 9:
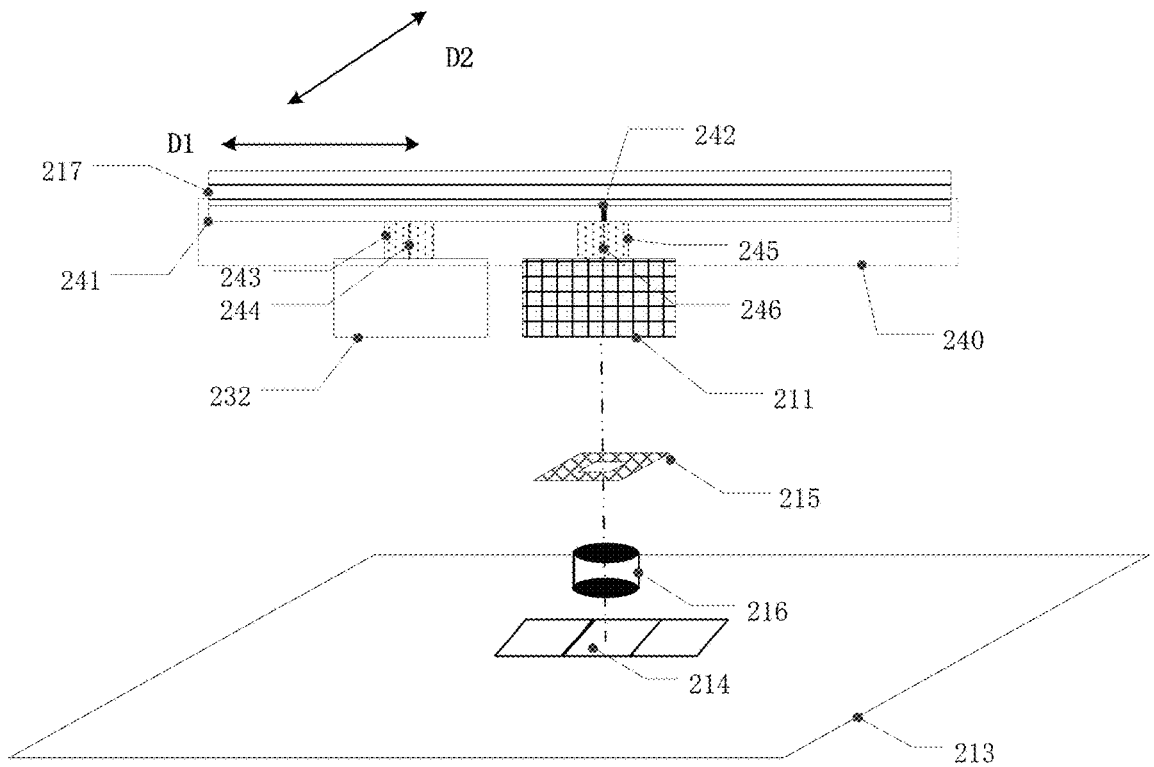
FIG. 9 is another exemplary side view of another display panel repair device provided by at least one embodiment of the present disclosure.

For example, FIG. 9 is another exemplary side view of another display panel repair device 200 provided by at least one embodiment of the present disclosure. For example, as illustrated in FIG. 9, the repair device 200 provided by at least one embodiment of the present disclosure can integrate the first image acquisition device 232 into the repair device 200 through adopting a second beam axis integration structure 240. For example, the second beam axis integration structure 240 is configured to allow the light path 219 of the first image acquisition device and the beam axis of the ultrasonic 218 to sequentially intersect the sub-pixel to be repaired of the display panel 213 through moving the ultrasonic generator 211 and the first image acquisition device 232. For example, specific configurations of the second beam axis integration structure 240 can be set according to specific implementation demands, and no specific limitation will be given to the embodiments of the present disclosure in this respect.

For example, as illustrated in FIG. 9, the second beam axis integration structure 240 may include a guide rail 241, a first slide block 243 and a second slide block 245. The guide rail 241 includes an alignment mark 242, the first slide block 243 fixedly connects with the first image acquisition device 232, the second slide block 245 fixedly connects with the ultrasonic generator 211, and the first slide block 243 and the second slide block 245 can slide on the guide rail 241.

For example, in the case where the first slide block 243 (for example, the alignment mark 244 of the first slide block) aligns with the alignment mark 242, the light path 219 of the first image acquisition device can intersect with the sub-pixel to be repaired of the display panel 213 (for example, the center of the pixel unit to be repaired); in the case where the second slide block 245 (for example, the alignment mark 246 of the second slide block) aligns with the alignment mark 242, the beam axis of the ultrasonic 218 can intersect with the sub-pixel to be repaired of the display panel 213 (for example, the center of the pixel unit 214 to be repaired). For example, in the case where the position of the guide rail 241 remains unchanged, the light path 219 of the first image acquisition device intersects with a position (which is referred to as first position) of the display panel 213 when the alignment mark 244 of the first slide block aligns with the alignment mark 242, and the beam axis of the ultrasonic 218 intersects with a position (which is referred to as second position) of the display panel 213 when the alignment mark 246 of the second slide block 245 aligns with the alignment mark 242; in this case, the first position and the second position are the same one position of the display panel 213.

For example, the second beam axis integration structure 240 may further include a lock-in mechanism (not illustrated in FIG. 9), and the lock-in mechanism can lock the first slide block 243 and/or the second slide block 245 on the guide rail 241 after the first slide block 243 and/or the second slide block 245 are moved to a pre-determined position.

For example, in the case where the repair device 200 is configured to realize the alignment between the ultrasonic generator 211 and the sub-pixel to be repaired by moving the ultrasonic generator 211 and the beam control device 212, the guide rail 241 may be fixedly connected with the displacement mechanism 217 of the repair device 200. For example, the operation principles of the second beam axis integration structure 240 and the repair device 200 provided by the embodiments of the present disclosure are illustratively described in the following with reference to an example, but the embodiments of the present disclosure are not limited to this case. Firstly, the displacement mechanism 217 can drive the ultrasonic generator 211 and the beam control device 212 to move with respect to the display panel 213 to be repaired based on the position information of the sub-pixel to be repaired of the display panel 213, and therefore the relative alignment between the ultrasonic generator 211 and the sub-pixel to be repaired can be realized; in this case, the alignment (for example, the coarse alignment) between the ultrasonic generator 211 and the sub-pixel to be repaired can be realized in the case where the alignment mark 246 of the second slide block aligns with the alignment mark 242 of the guide rail; and the alignment (for example, coarse alignment) between the first image acquisition device 232 and the sub-pixel to be repaired can be realized in the case where the alignment mark 244 of the first slide block aligns with the alignment mark 242 of the guide rail. After that, in the case where the alignment mark 244 of the first slide block is not aligned with the alignment mark 242 of the guide rail, the alignment mark 244 of the first slide block is allowed to align with the alignment mark 242 of the guide rail. Next, the position of the displacement mechanism 217 can be fine tuned based on the image, which is acquired by the first image acquisition device 232, of at least part of the display region (for example, several pixel units) of the display panel 213, so as to allow, for example, the first image acquisition device 232 to coincide with the center of the pixel unit 214 to be repaired. Lastly, there are operations of moving the first slide block 243 away, and aligning the alignment mark 246 of the second slide block with the alignment mark 242 of the guide rail, so as to allow the ultrasonic outputted by the ultrasonic generator 211 to repair the pixel unit 214 to be repaired. Because the center of the beam axis of the ultrasonic 218 intersects with the pixel unit 214 to be repaired in this case, the display panel repair device 200 has a further increased repair rate and a further improved repair effect.

For example, the second beam axis integration structure 240 provided by the embodiments of the present disclosure is not limited to the translation structure as illustrated in FIG. 9, and the second beam axis integration structure 240 provided by the embodiments of the present disclosure may also be other structures which can allow the light path 219 of the first image acquisition device and the beam axis of the ultrasonic 218 to sequentially intersect with the pre-determined position of the display panel 213. For example, according to specific implementation demands, the second beam axis integration structure 240 provided by the embodiments of the present disclosure may also be in a rotating type structure. For example, specific configuration of the rotating type structure may refer to the configuration of the convertor of a microscope, which is used to change the position of a plurality of eyepieces with respect to the objective lens, and no further descriptions will be given here.

For example, according to specific implementation demands, the alignment device 231 of the repair device 200 may further include a second image acquisition device. For example, the second image acquisition system may be configured to obtain the position information of the sub-pixel to be repaired through acquiring the image of the entire display panel 213. For example, the second image acquisition system may obtain the information of the number of the bright dots and the positions of the bright dots through acquiring the image of the entire display panel 213 in all-black operation mode. For example, the position information of the bright dots may include the column and row of the bright dot, or the position coordinates of the bright dots of the display panel 213 with respect to a reference point (for example, the reference point may be the lower left-hand corner of the display panel 213 viewed from the light-emitting side), and no specific limitation will be given to the embodiments of the present disclosure in this respect. For example, the position information of the bright dot may be provided to the control device of the displacement mechanism 217, so as to allow the ultrasonic generator 211 and the beam control device 212 to be moved with respect to the display panel 213 to be repaired, and to realize the alignment between the ultrasonic generator 211 and the sub-pixel to be repaired. For example, the second image acquisition system may be fixed at the light-emitting side of the display panel 213; for another example, the second image acquisition system may also be provided at the light-emitting side of the display panel 213 when acquiring of the image of the entire display panel 213 is required, and no specific limitation will be given to the embodiments of the present disclosure in this respect.

Figure 10:
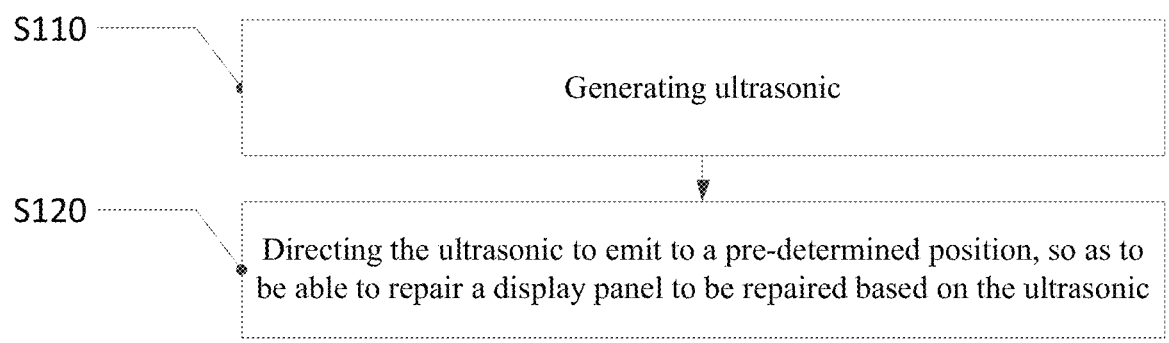
FIG. 10 is an exemplary flow chart of a display panel repair method provided by at least one embodiment of the present disclosure.

At least one embodiment of the present disclosure further provides a repair method for a display panel, as illustrated in FIG. 10, the display panel repair method includes the following steps.

In step S110: generating ultrasonic.

In step S120: directing the ultrasonic to emit to a pre-determined position so as to be able to repair a display panel to be repaired by the ultrasonic.

For example, the display panel includes a plurality of sub-pixels arranged in parallel; and the ultrasonic is directed to emit to the sub-pixel to be repaired of the display panel to be repaired. For example, the ultrasonic can only act on the sub-pixel to be repaired of the display panel to be repaired through controlling (for example, through shielding or through focusing) the parameter of the ultrasonic (for example, the size of and/or the energy density of the beam of the ultrasonic) which is incident onto the sub-pixel to be repaired of the display panel to be repaired.

For example, the display panel repair method may further include: obtaining the position information of the sub-pixel to be repaired through acquiring the image of at least part of the display region of the display panel so as to direct the ultrasonic to emit to the sub-pixel to be repaired. For example, the display panel repair method may further include: allowing at least part of the ultrasonic to be able to be incident onto the sub-pixel to be repaired through reflection, and allowing the image of the sub-pixel to be repaired to be able to be acquired through transmission.

For example, an ultrasonic generation method, methods of setting and controlling the parameter of the ultrasonic, and a method of aligning the beam of the ultrasonic with the sub-pixel to be repaired of the display panel to be repaired can be referred to the repair device embodiments, and no further descriptions will be given here.

For example, after the ultrasonic outputted by the ultrasonic generator is incident onto the pixel unit to be repaired (for example, the pixel unit with the bright dot defect), the violent vibration of the ultrasonic may cause relevant structures (for example, the material of the organic light-emitting layer) of the pixel unit to perform high-frequency vibration. Furthermore, part of the energy of the ultrasonic can be converted into thermal energy, which causes an increase of the temperature of the local region adjacent to the action spot of the ultrasonic. Therefore, the ultrasonic can destroy the relevant structures (for example, destroy the material of the organic light-emitting layer) of the pixel unit, and cause the pixel unit to be repaired not to emit light, and thus the display panel repair device provided by at least one embodiment of the present disclosure can repair the pixel unit to be repaired into a dark dot, and the repair device has a relatively high success rate of reparation. For example, because the thermal effect caused by the ultrasonic is far smaller than the thermal effect caused by laser, the influence of the ultrasonic outputted by the ultrasonic generator on the pixel units adjacent to the pixel unit to be repaired is relatively small. Therefore, for the display panel repair method provided by at least one embodiment of the present disclosure, during the process of repairing the pixel unit to be repaired into the dark dot, the adverse influence to the pixel units adjacent to the pixel unit to be repaired can be deceased and the repair effect can be improved. For example, the repair rate of the display panel may be improved and/or the adverse effect to the pixel units adjacent to the pixel unit to be repaired may be reduced (i.e., the repair effect of the display panel is improved) through controlling the size of and/or the energy density of the ultrasonic which is incident onto the sub-pixel to be repaired of the display panel to be repaired.

It is apparent that the presented disclosure may be changed and modified by those skilled in the art without departure from the spirit and scope of the disclosure, if the above-mentioned changes and modifications of the presented disclosure belong to the scope of the claims of the presented disclosure and its equivalent technologies, the presented disclosure is intended to include the above changes and modifications.

What are described above is related to the illustrative embodiments of the disclosure only and not limitative to the scope of the disclosure; the scopes of the disclosure are defined by the accompanying claims.

What is claimed is:

1. A display panel repair device, comprising:
   an ultrasonic generator, which is configured to generate ultrasonic; and
   a beam control device, which is configured to direct the ultrasonic to emit to a pre-determined position of a display panel to be repaired, so as to be able to repair the display panel to be repaired by the ultrasonic,
   wherein the beam control device comprises a beam size control component provided in an emitting path of the ultrasonic, the beam size control component is configured to control a parameter of the ultrasonic which is incident onto a sub-pixel to be repaired of the display panel to be repaired, so as to allow the ultrasonic to be able to act on the sub-pixel to be repaired of the display panel to be repaired only,
   wherein the beam size control component comprises a beam-shielding region which blocks the ultrasonic and a beam-transmitting region allows the ultrasonic to pass through.

2. The repair device according to claim 1, wherein the beam size control component comprises two slits which intersect with each other;
   a distance between the two slits is adjustable; and
   an intersection area of the two slits forms the beam-transmitting region for the ultrasonic.

3. The repair device according to claim 1, wherein the beam control device comprises a beam focusing element;
   the beam focusing element is provided in an emitting path of the ultrasonic; and
   the beam focusing element is configured to focus the ultrasonic.

4. The repair device according to claim 1, further comprising an alignment device,
   wherein the alignment device is configured to align the beam control device with a sub-pixel to be repaired of the display panel; and
   the alignment device comprises a first image acquisition device, and the first image acquisition device is configured to obtain position information of the sub-pixel to be repaired through acquiring an image of at least part of a display region of the display panel.

5. The repair device according to claim 4, further comprising a beam axis integration structure,
   wherein the beam axis integration structure is configured to allow a light path of the first image acquisition device to coincide with a beam axis of the ultrasonic on the display panel; and
   the beam axis integration structure is configured to allow at least part of the ultrasonic outputted by the ultrasonic generator to be able to be incident onto the sub-pixel to be repaired through reflection, and to allow the first image acquisition device to be able to acquire an image of the sub-pixel to be repaired through transmission, and the light path of the first image acquisition device coincides with the beam axis of the ultrasonic on the display panel.

6. The repair device according to claim 5, wherein the beam axis integration structure comprises a glass plate;
   the glass plate comprises a first surface and a second surface;
   the ultrasonic generator faces toward the first surface, and the ultrasonic outputted by the ultrasonic generator is incident onto the first surface and is reflected to the sub-pixel to be repaired by the first surface; and
   the first image acquisition device faces toward the second surface, light of the image of the sub-pixel to be repaired is incident onto the first surface and is able to transmitted from the first surface to the first image acquisition device through transmission, wherein the first image acquisition device is located at a side, at which the second surface is provided, of the glass plate.

7. The repair device according to claim 4, further comprising a second beam axis integration structure,
wherein the second beam axis integration structure is configured to allow a light path of the first image acquisition device and a beam axis of the ultrasonic to be able to sequentially intersect the sub-pixel to be repaired by moving the ultrasonic generator and the first image acquisition device.

8. The repair device according to claim 7, wherein the second beam axis integration structure comprises:
a guide rail, which comprises an alignment mark;
a first slide block, which fixedly connects with the first image acquisition device, wherein the first slide block is configured to allow the light path of the first image acquisition device to be able to intersect with the sub-pixel to be repaired; and
a second slide block, which fixedly connects with the ultrasonic generator, wherein the second slide block is configured to allow the beam axis of the ultrasonic to be able to intersect with the sub-pixel to be repaired.

9. The repair device according to claim 1, further comprising a displacement mechanism,
wherein the displacement mechanism is configured to move the ultrasonic generator and the beam control device with respect to the display panel to be repaired based on position information of a sub-pixel to be repaired of the display panel so as to realize alignment between the ultrasonic generator and the sub-pixel to be repaired.

10. The repair device according to claim 9, wherein the displacement mechanism realizes the alignment between the ultrasonic generator and the sub-pixel to be repaired by moving the ultrasonic generator and the beam control device.

11. A display panel repair method, comprising:
generating ultrasonic;
directing the ultrasonic to emit to a pre-determined position, so as to be able to repair a display panel to be repaired by the ultrasonic; and
controlling a parameter of the ultrasonic which is incident onto the sub-pixel to be repaired of the display panel to be repaired, so as to allow the ultrasonic to be able to act on a sub-pixel to be repaired of the display panel to be repaired only,
wherein a size of a beam of the ultrasonic, which is incident onto the sub-pixel to be repaired, is controlled through shielding, and
wherein an energy density of a beam of the ultrasonic, which is incident onto the sub-pixel to be repaired, is controlled through focusing.

12. The repair method according to claim 11, wherein the display panel comprises a plurality of sub-pixels arranged in parallel; and
the ultrasonic is directed to emit to a sub-pixel to be repaired of the display panel to be repaired.

13. The repair method according to claim 12, further comprising:
obtaining position information of the sub-pixel to be repaired through acquiring an image of at least part of a display region of the display panel so as to direct the ultrasonic to emit to the sub-pixel to be repaired.

14. The repair method according to claim 13, further comprising:
allowing at least part of the ultrasonic to be able to be incident onto the sub-pixel to be repaired through reflection, and allowing the image of the sub-pixel to be repaired to be able to be acquired through transmission.

15. The repair device according to claim 1, wherein the beam control device comprises a beam focusing element;
the beam focusing element is provided in an emitting path of the ultrasonic; and
the beam focusing element is configured to focus the ultrasonic.

16. The repair method according to claim 12, further comprising:
controlling a parameter of the ultrasonic which is incident onto the sub-pixel to be repaired of the display panel to be repaired, so as to allow the ultrasonic to be able to act on a sub-pixel to be repaired of the display panel to be repaired only.

* * * * *